(12) United States Patent
Wehlus et al.

(10) Patent No.: US 9,196,870 B2
(45) Date of Patent: Nov. 24, 2015

(54) ORGANIC LIGHT-EMITTING DIODE

(71) Applicant: OSRAM Opto Semiconductors GmbH, Regensburg (DE)

(72) Inventors: Thomas Wehlus, Lappersdorf (DE); Carola Diez, Regensburg (DE); Stefan Seidel, Wenzenbach (DE); Ulrich Niedermeier, Leiblfing (DE); Arndt Jaeger, Regensburg (DE); Nina Riegel, Tegernheim (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/380,360

(22) PCT Filed: Feb. 21, 2013

(86) PCT No.: PCT/EP2013/053482
§ 371 (c)(1),
(2) Date: Aug. 21, 2014

(87) PCT Pub. No.: WO2013/124371
PCT Pub. Date: Aug. 29, 2013

(65) Prior Publication Data
US 2015/0014674 A1    Jan. 15, 2015

(30) Foreign Application Priority Data
Feb. 24, 2012 (DE) .......................... 10 2012 202 839

(51) Int. Cl.
*H01L 29/08* (2006.01)
*H01L 29/18* (2006.01)
(Continued)

(52) U.S. Cl.
CPC .......... *H01L 51/5271* (2013.01); *H01L 51/504* (2013.01); *H01L 51/5044* (2013.01); *H01L 51/5265* (2013.01)

(58) Field of Classification Search
CPC ... H01L 51/504; H01L 51/50; H01L 51/5271; H01L 51/5265; H01L 33/08; H01L 33/42
USPC .................. 257/40, 88, 98; 438/29
See application file for complete search history.

(56) References Cited

U.S. PATENT DOCUMENTS 6,403,983 B1 *   6/2002   Mizuno ........................... 257/79
2006/0175966 A1 *  8/2006   Yamada et al. ............... 313/506
(Continued)

FOREIGN PATENT DOCUMENTS

DE    102008023874 A1    8/2009
DE    102009016957 A1    12/2010
(Continued)

OTHER PUBLICATIONS

"Novaled's OLED Lighting Meets International Specifications", <http://www.novaled.com/press_news/news_press_releases/newsitem/novaleds_grossflaechige_oled_erfuellt_internationale_spezifikationen_fuer_beleuchtung/>, Aug. 20, 2009.

(Continued)

*Primary Examiner* — Ha Tran T Nguyen
*Assistant Examiner* — Dzung Tran
(74) *Attorney, Agent, or Firm* — McDermott Will & Emery LLP

(57) ABSTRACT

In at least one embodiment of the organic light-emitting diode (1), this comprises a mirror (3) and an organic layer sequence (4). The organic layer sequence (4) contains a first active layer (41) for producing first radiation and at least two second active layers (42, 43) for producing second radiation. The active layers (41, 42, 43) are arranged one above the other in a main direction (x) away from the mirror (3). A charge generation layer (45) is located in each case between two adjacent active layers (41, 42, 43). The second active layers (42, 43) each have the same at least two radiation active organic materials. The first active layer (41) has a radiation active organic material which is different therefrom.

11 Claims, 5 Drawing Sheets

Figure 1:
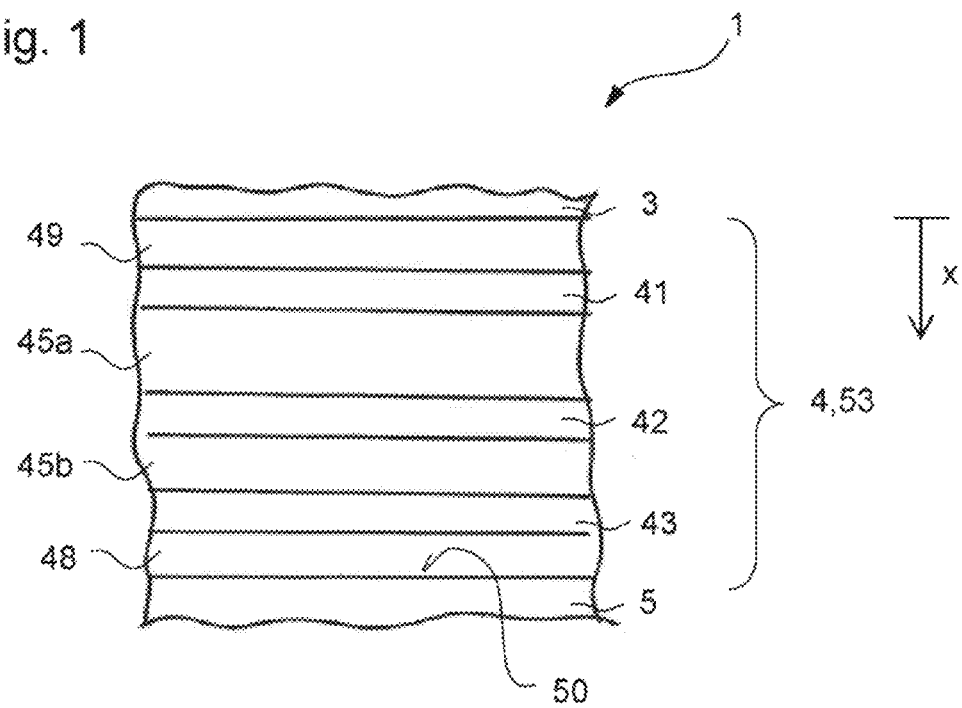

(51) Int. Cl.
   *H01L 33/00* (2010.01)
   *H01L 21/00* (2006.01)
   *H01L 51/52* (2006.01)
   *H01L 51/50* (2006.01)

(56) References Cited

U.S. PATENT DOCUMENTS

2006/0267485 A1* 11/2006 Wood et al. .................. 313/504
2007/0066178 A1* 3/2007 Yamada et al. ................. 445/24
2007/0102737 A1* 5/2007 Kashiwabara et al. ....... 257/291
2010/0314636 A1 12/2010 Matsunami et al.

FOREIGN PATENT DOCUMENTS

| DE | 102009048604 A1 | 4/2011 |
|---|---|---|
| DE | 102012208235 A1 | 11/2013 |
| EP | 1734792 A1 | 12/2006 |
| EP | 2068380 A1 | 6/2009 |
| EP | 2330651 A2 | 6/2011 |
| JP | 2007012369 A | 1/2007 |
| WO | 2009/090248 A1 | 7/2009 |

OTHER PUBLICATIONS

"First commercial OLED—Module by Philips", <http://www.newscenter.philips.com/de_de/standard/about/news/press/licht/20100412_erstes_kommerzielles_oled_modul_von_philips.wpd>, Apr. 12, 2010.

* cited by examiner

ORGANIC LIGHT-EMITTING DIODE

An organic light-emitting diode is provided.

An object to be achieved resides in the provision of an organic light-emitting diode whose radiation has a high colour rendering index.

In accordance with at least one embodiment of the light-emitting diode, this comprises a mirror. The mirror is arranged to reflect at least 50% or at least 80% or at least 95% of the radiation produced during operation of the light-emitting diode, in particular visible radiation. In particular, the mirror is impermeable to visible light. For example, the mirror is a metal mirror which comprises or consists of silver and/or aluminium. The mirror can also form an electrode, e.g., a cathode, of the light-emitting diode.

In accordance with at least one embodiment, the light-emitting diode includes one or more organic layer sequences. The organic layer sequence is based wholly or partly on organic materials. The organic layer sequence preferably directly adjoins the mirror and contacts the mirror over the whole surface or in regions.

In accordance with at least one embodiment of the light-emitting diode, the organic layer sequence comprises one or more first active layers. The first active layer is arranged to produce first radiation. The first radiation is, in particular, blue light or red light.

In accordance with at least one embodiment, the organic layer sequence comprises precisely two, or more than two, second active layers. The second active layers are arranged to each produce second radiation. The second radiation can preferably be mixed radiation. In particular, the second radiation is yellow light, orange light or cyan light.

In accordance with at least one embodiment of the light-emitting diode, the active layers are arranged one above the other in a main direction away from the mirror. Main extension directions of the active layers are then oriented preferably in parallel with the mirror. In other words, as seen in a plan view of the light-emitting diode, the active layers completely or partly overlap one another.

In accordance with at least one embodiment of the light-emitting diode, a charge generation layer (CGL) is located at least between two of the active layers or in each case between two adjacent active layers. Preferably, the light-emitting diode comprises at least two or precisely two charge generation layers.

In accordance with at least one embodiment of the light-emitting diode, the at least two second active layers each have the same at least two mutually different radiation active organic materials. In particular, the second active layers each have precisely two radiation active organic materials. The radiation active organic materials can be, in each case, fluorescent or phosphorescent materials.

In accordance with at least one embodiment of the light-emitting diode, the first active layer has precisely one, or more, radiation active organic materials. The one or the at least one radiation active organic material or all the radiation active organic materials of the first active layer are different from the radiation active organic materials of the second active layers. In other words, the second active layers differ from the first active layer in at least one of the radiation active organic materials. The radiation active organic material of the first layer can also be a fluorescent or phosphorescent material, too.

According to at least one embodiment of the organic light-emitting diode, this comprises a mirror and an organic layer sequence. The organic layer sequence contains a first active layer for producing first radiation and at least two second active layers for producing a second radiation. The active layers are arranged one above the other in a main direction away from the mirror. A charge generation layer is located in each case between two adjacent active layers. The second active layers each have the same at least two radiation active organic materials. The first active layer has a radiation active organic material which is different therefrom.

It is thus possible that, in terms of a material composition, the organic light-emitting diode comprises only two types of active layers which are designed in a mutually different manner. The organic light-emitting diode can hereby be produced in an efficient and cost-effective manner. By using a total of at least three, or precisely three, active layers, i.e. the first active layer and the at least two second active layers, a high colour rendering index of the radiation produced by the light-emitting diode can be achieved.

In accordance with at least one embodiment of the light-emitting diode, this comprises an optical boundary layer on which there is jump in the refractive index between two different materials of the light-emitting diode. The jump in the refractive index is present in particular on a boundary layer between the organic layer sequence and an adjoining, preferably at least partly radiation-permeable, electrode. The optical boundary layer can be located on a side of the organic layer sequence facing away from the mirror.

In accordance with at least one embodiment of the light-emitting diode, an optical cavity is formed by the mirror and the optical boundary layer. In other words, the cavity is delimited and defined by the mirror and the reflecting optical boundary layer. The optical cavity can have optical properties similar to a Fabry-Perot element and/or a resonator. However, in a particularly preferred manner, the cavity is not a resonator for producing laser radiation. The radiation emitted by the organic light-emitting diode is preferably incoherent radiation and not laser radiation.

In accordance with at least one embodiment of the light-emitting diode, the cavity has several intensity maxima in the main direction. The term "intensity maximum" refers in particular to a self-interference minimum. This means: when radiation emitted at a point in the main direction strikes the mirror, a phase jump of $\pi$ occurs and effectively constructionally interferes with itself, then an intensity maximum is present and, in the case of destructive interference, an intensity minimum is present. The position of the intensity maxima is dependent on a refractive index profile within the organic layer sequence as well as on the wavelength of the radiation in question.

In accordance with at least one embodiment, the active layers are located, in the main direction, in each case in or on one of the intensity maxima. This can mean that the active layer overlaps with the intensity maximum in question. For example, a geometric centre of the active layer is located, in the main direction, at the corresponding intensity maximum with a tolerance of at the most 10 nm or at the most 20 nm or at the most 30 nm.

The active layers are preferably each present in an intensity maximum for blue light, for green light and for red light. Blue light refers in particular to radiation having a wavelength between 430 nm and 490 nm inclusive, green light refers to radiation having a wavelength between 525 nm and 575 nm inclusive and red light refers to radiation having a wavelength in particular between 595 nm and 670 nm inclusive. For example, the active layers are located in or on an intensity maximum for a wavelength of 450 nm, for a wavelength of 555 nm and for a wavelength of 615 nm, in each case with a tolerance of at the most 5 nm, at the most 10 nm or at the most 20 nm.

In accordance with at least one embodiment of the light-emitting diode, the individual active layers are located, in the main direction, in each case at a position P as per the following formula: $P=\lambda/(4n)+k\,\lambda/(2n)$. The position P is preferably maintained with a tolerance of at the most $\lambda/(10n)$ or at the most $\lambda/(20n)$. The positional information relates in particular to a geometric centre of the associated active layer. n relates to the average refractive index of the organic layer sequence which is, for example, between 1.7 and 1.9 inclusive. $\lambda$ relates to the vacuum wavelength of the radiation, the relevant active layer being arranged for the production thereof. k is a natural number greater than or equal to 0. In particular, k equals 0, 1, 2 or 3.

In accordance with at least one embodiment of the light-emitting diode, for the first active layer, k equals 0 or 1.

In accordance with at least one embodiment of the light-emitting diode, for the second active layers, k is greater than 0. In particular, k equals 1 or 2. It is possible that the first active layer is in a first intensity maximum of the cavity and the two second active layers are in the second intensity maximum. For the second active layers, k can be identical or even different, in particular different by at the most 1 or by at the most 2.

In accordance with at least one embodiment of the light-emitting diode, a distance between adjacent second active layers is smaller than a distance between the first active layer and the closest second active layer. In other words, the second active layers lie relatively close to each other. The first active layer is preferably not located between the second active layers. For example, a distance between the adjacent second active layers is at least 20 nm or at least 60 nm and alternatively or in addition at the most 150 nm or at the most 100 nm. The distance between the first active layer and the closest second active layer is, for example, at least 80 nm or at least 130 nm and alternatively or in addition at the most 175 nm or at the most 140 nm.

In accordance with at least one embodiment of the light-emitting diode, the second active layers are optimised for mutually different wavelengths. "Optimised" means in particular that the second active layers are located at positions as per the above-mentioned formula for the position P, wherein preferably k is identical for at least two of the second active layers. For example, the wavelengths, for which the second active layers are optimised, are at 555 nm and 615 nm.

In accordance with at least one embodiment of the light-emitting diode, the second active layers each have a red-emitting radiation active organic material and a green-emitting radiation active organic material. It is possible that the second active layers only have the two said radiation active organic materials and no further such materials.

In accordance with at least one embodiment of the light-emitting diode, the at least two second active layers have a blue-emitting radiation active organic material and additionally a green-emitting radiation active organic material. Preferably, in that case, no further radiation active organic materials are present in the second active layers.

In accordance with at least one embodiment of the light-emitting diode, the optical boundary layer has, for the radiation produced during operation of the light-emitting diode, an average reflectivity of at least 25% or at least 30%. Alternatively or additionally, the average reflectivity is at the most 60% or at the most 50%. "Average reflectivity" means that the reflectivity is averaged over all wavelengths emitted by the organic light-emitting diode during normal use. The average reflectivity can thus relate to white light.

In accordance with at least one embodiment of the organic light-emitting diode, at least two of the active layers or all active layers have an identical material composition, within manufacturing tolerances. In particular, the at least two radiation active organic materials are incorporated in the second active layers in an identical mix ratio and/or in an identical spatial distribution. In other words, the second active layers can be produced in the same manner and with the same starting materials.

In accordance with at least one embodiment of the light-emitting diode, the second active layers have identical or mutually different thicknesses. For example, that layer of the second active layers which is located in an intensity maximum for green light has a greater thickness than one of the second active layers which is located in an intensity maximum for red light, or vice-versa.

In accordance with at least one embodiment of the light-emitting diode, a distance between adjacent active layers is adjusted by a thickness of the respective charge generation layer located between these active layers. The thicknesses of the charge generation layers can be different from each other by at least a factor of 1.5 or by at least a factor of 1.75.

In accordance with at least one embodiment of the light-emitting diode, one or more barrier layers is/are allocated to the active layers in each case. The barrier layers preferably directly adjoin a layer having the radiation active organic material of the active layer. The barrier layers are charge carrier barrier layers for holes or for electrons. Preferably, an electron barrier layer is allocated to each of the active layers. In particular, a hole barrier layer is allocated at least to each of the second active layers.

In accordance with at least one embodiment of the light-emitting diode, the charge generation layers directly adjoin one or two of the barrier layers which are allocated to the closest active layers. The charge generation layers can each directly border a hole barrier layer and an electron barrier layer.

In accordance with at least one embodiment of the light-emitting diode, the thicknesses of the active layers, taken together with the respectively allocated barrier layers, are at least 25 nm or at least 30 nm. Alternatively or in addition, the thicknesses of the active layers, together with the allocated barrier layers, are at the most 60 nm or at the most 50 nm.

In accordance with at least one embodiment of the light-emitting diode, the thicknesses of the charge generation layers are between 20 nm and 150 nm inclusive and/or at the most 40 nm or at the most 130 nm.

In accordance with at least one embodiment of the light-emitting diode, the first active layer is arranged for producing blue light. The first active layer can be located in an intensity maximum for blue light. The second active layers are each preferably yellow-emitting layers having a green-emitting and a red-emitting radiation active organic material.

In accordance with at least one embodiment of the light-emitting diode, the second active layer located closer to the mirror is optimised for producing green light. This second active layer is preferably located in an intensity maximum for green light. Preferably, the second active layer located further away from the mirror is located in an intensity maximum for red light and is thus optimised for producing red light.

A light-emitting diode described herein is explained in greater detail below on the basis of exemplary embodiments with reference to the drawing. Like reference numerals designate like elements in the individual figures. However, the references are not illustrated to scale; rather individual elements may be illustrated excessively large in order to afford a better understanding.

Figure 2:
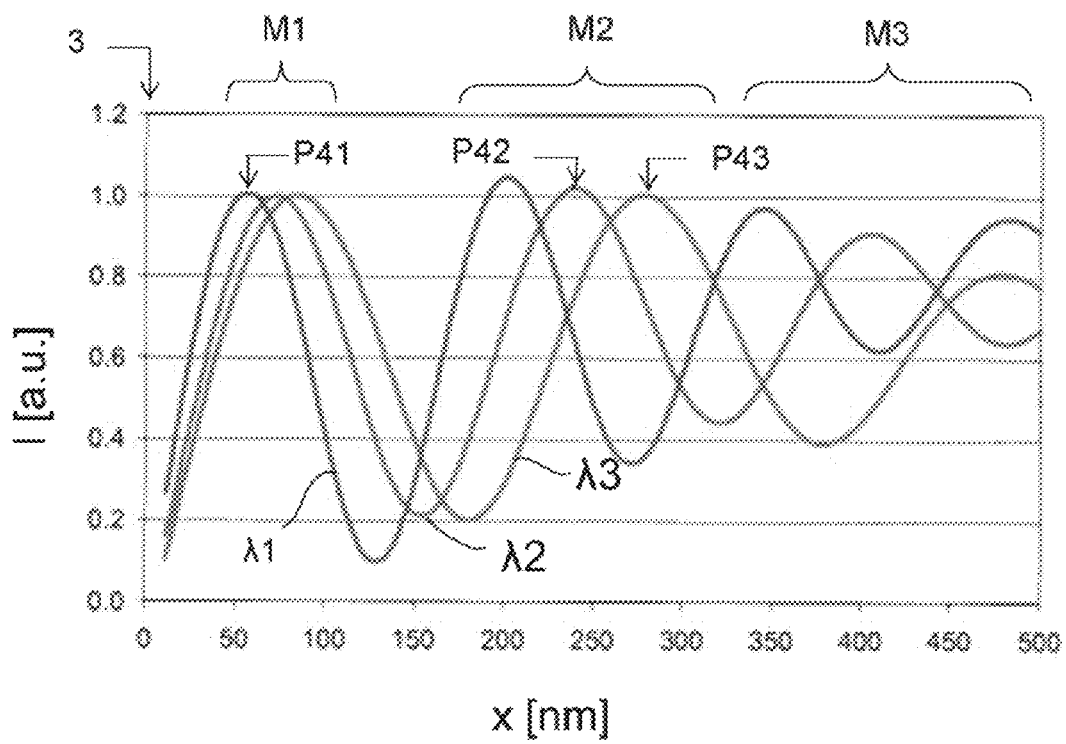
Figure 3:
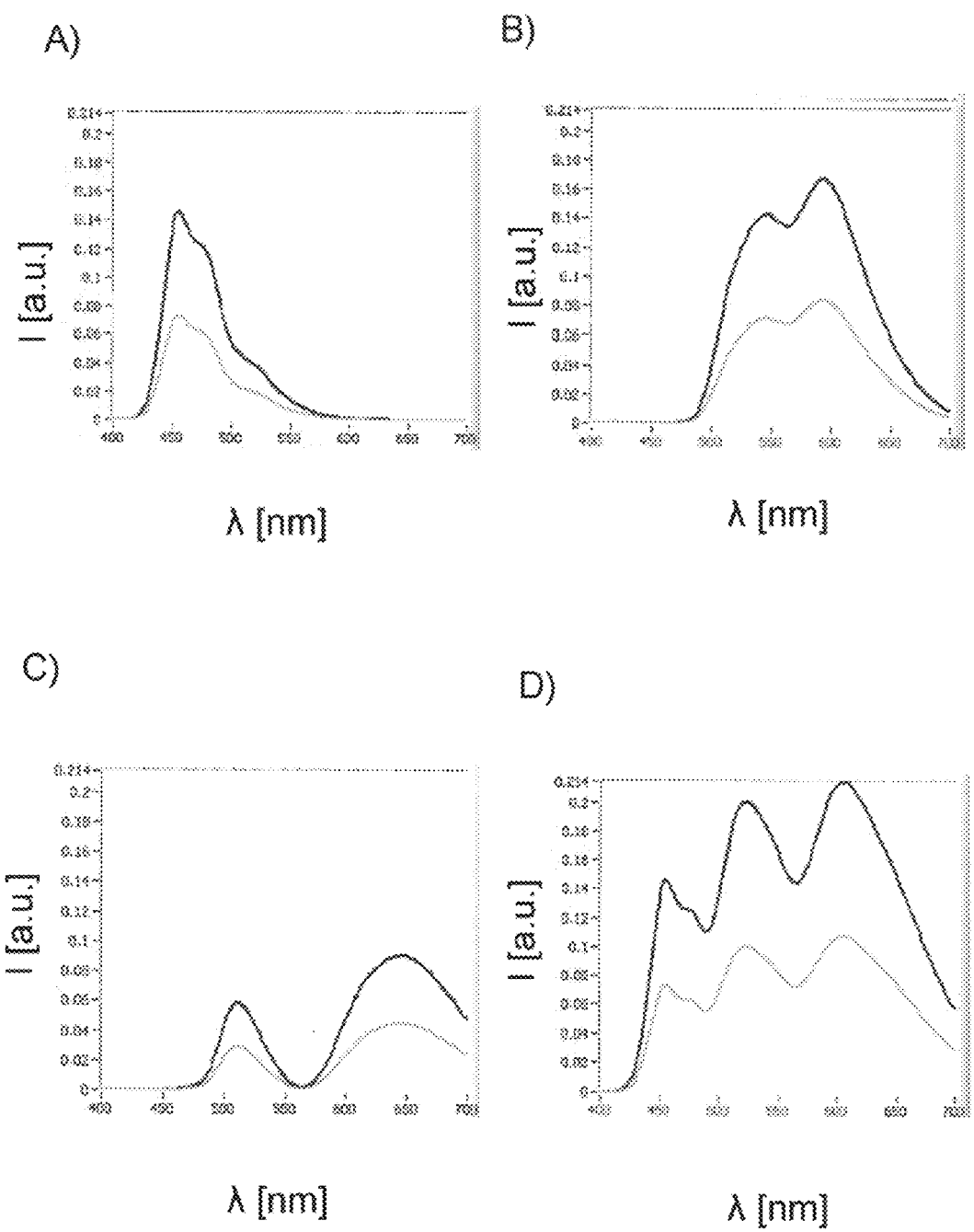
Figure 4:
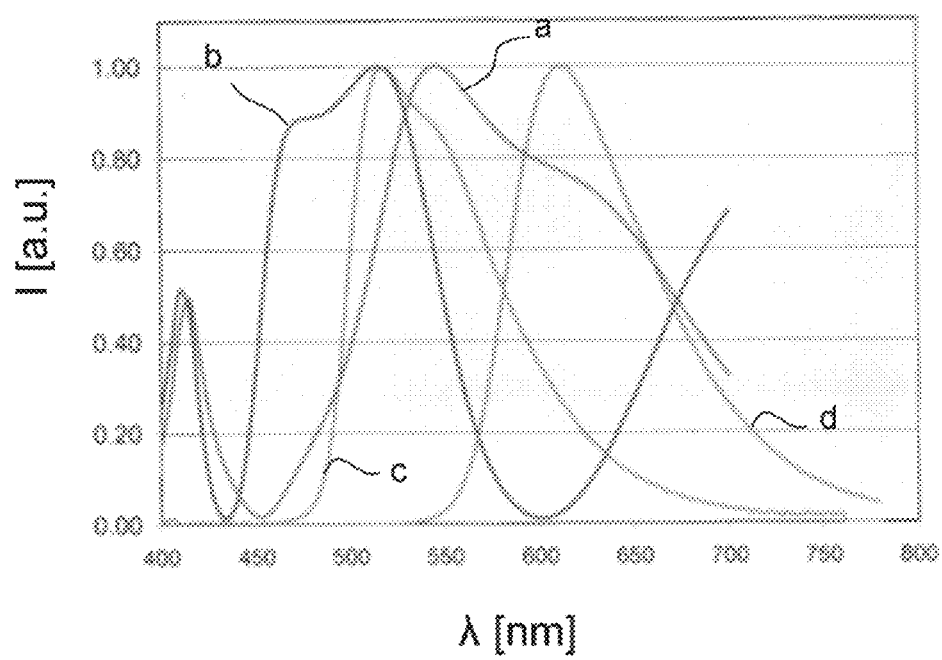
Figure 5:
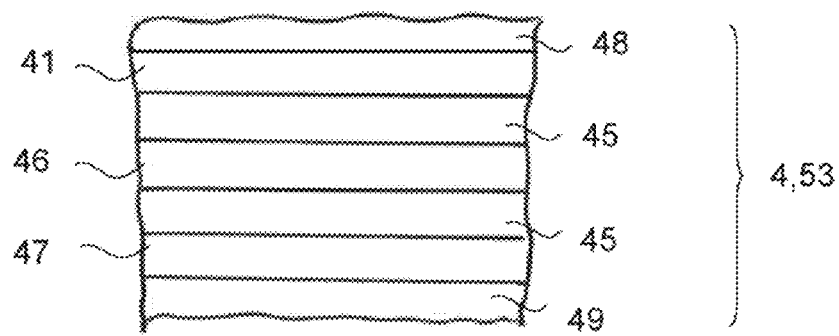
Figure 6:
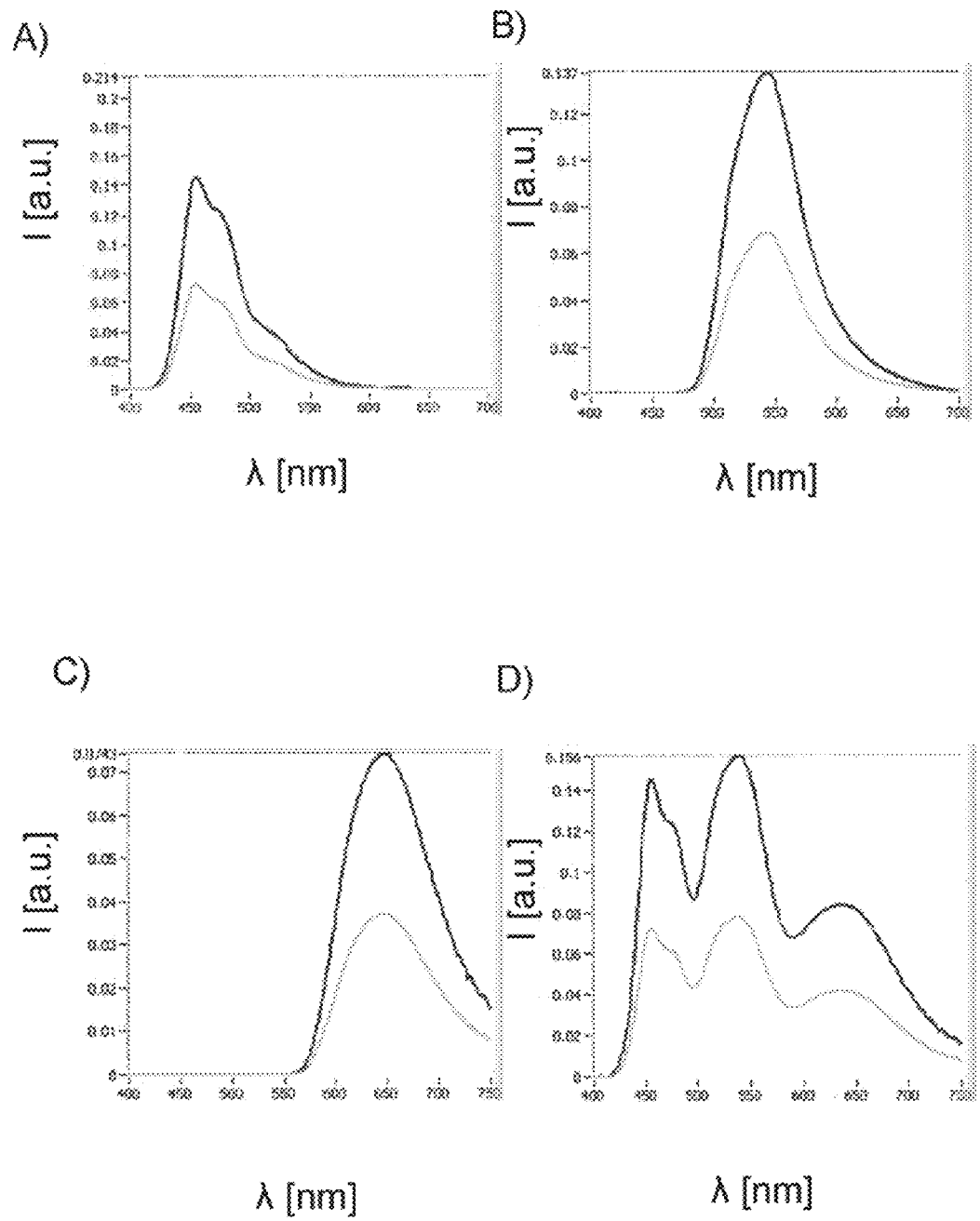
Figure 7:
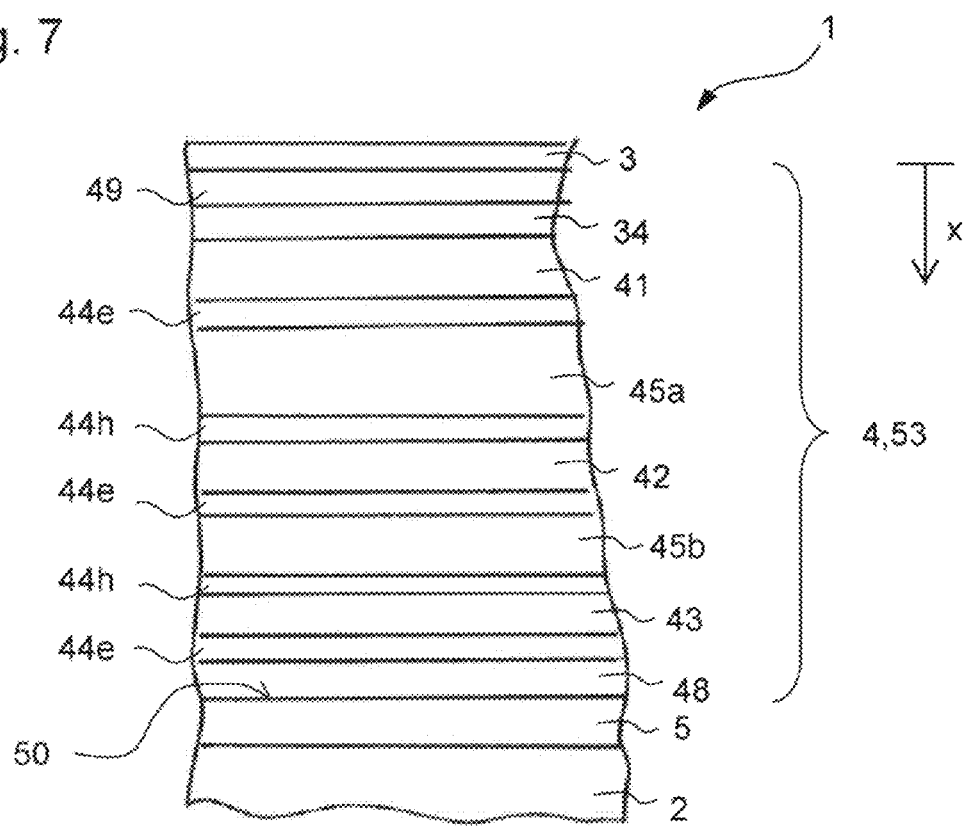
Figure 8:
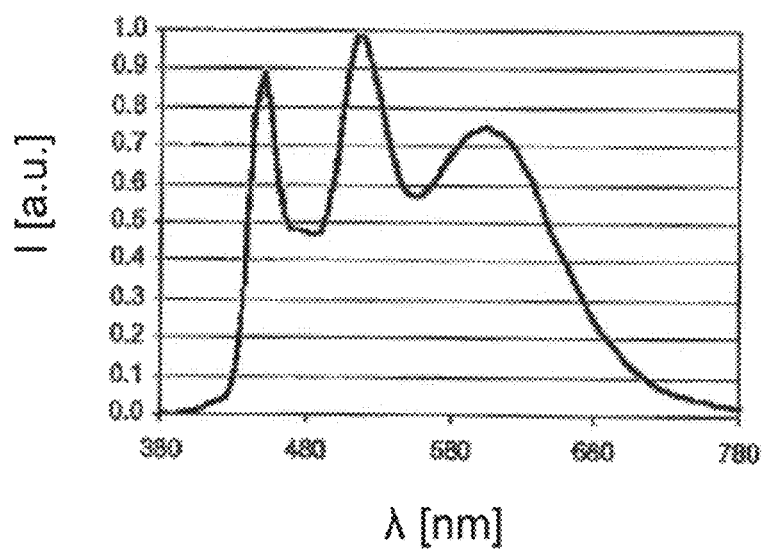

In the figures:

FIGS. 1 and 7 are schematic sectional illustrations of exemplified embodiments of organic light-emitting diodes described herein, FIG. 2 is an illustration of an intensity profile in a direction away from a mirror of an exemplified embodiment of an organic light-emitting diode described herein, FIGS. 3, 4, 6 and 8 are schematic illustrations of wavelength profiles of optical properties of organic light-emitting diodes, and FIG. 5 is a schematic sectional illustration of a conventional organic light-emitting diode.

FIG. 1 shows a schematic sectional illustration of an exemplified embodiment of an organic light-emitting diode 1. An optical cavity 53 is formed by a mirror 3 and by an optical boundary layer 50. The boundary layer 50 has a jump in the optical refractive index. An average reflectivity of the optical boundary layer 50 for visible light is, for example, at about 40%.

An organic layer sequence 4 is located within the optical cavity 53. The layer sequence 4 includes a first active layer 41 and two second active layers 42, 43. A charge generation layer 45a, 45b is located in each case between two adjacent active layers 41, 42, 43. The organic light-emitting diode 1 comprises precisely three of the active layers 41, 42, 43. A thickness of the organic layer sequence 4 is, for example, between 150 nm and 600 nm inclusive.

An electron injection layer 49 is also located between the first active layer 41 and the mirror 3. A hole injection layer 48 is attached to the optical boundary layer 50. Said layers of the organic layer sequence 4 can directly follow each other in the stated sequence. Likewise, further intermediate layers, not illustrated, can be attached.

The first active layer 41 has a radiation active organic material, in which electromagnetic radiation is produced, in particular in the blue spectral range, during operation of the light-emitting diode 1 via fluorescence or phosphorescence.

The second active layers 42, 43 each have the same at least two radiation active organic materials which are arranged for emitting red light and for emitting green light. The second active layers 42, 43 preferably do not differ, or do not significantly differ, in their material composition. The at least two radiation active organic materials can be mixed homogeneously in the second active layers 42, 43 or can also be provided as separate partial layers.

FIG. 2 plots an intensity I in a main direction x, perpendicular to the mirror 3 and away from the mirror 3. Owing to the optical boundary layer 50 and the mirror 3, the intensity I approximates the intensity in a Fabry-Perot element and/or in a resonator. An intensity minimum is present directly at the mirror 3. Several maxima and minima then occur in each case in the direction x and away from the mirror 3. The maxima and minima in respect of the intensity are less pronounced towards the optical boundary layer 50.

The intensity profile is plotted in the direction x for several wavelengths. The wavelengths $\lambda 1$ is 450 nm, $\lambda 2$ is 555 nm and $\lambda 3$ is 615 nm. First maxima M1 are located at a position between about 50 nm and 100 nm. Second maxima M2 are located between about 175 nm and 300 nm. Third maxima M3 are located between about 325 nm and 525 nm. A position P of the maxima M1, M2, M3 is, in addition to the wavelength, likewise dependent on a refractive index n within the organic layer sequence 4 and approximately follows the correlation $P=\lambda/(4\ n)+k\ \lambda/(2\ n)$, wherein k is a natural number and $k \geq 0$.

The first active layer 41 is attached at position P41 and is located in the first maximum M1 for the wavelength $\lambda 1$. The first active layer 41 is thus optimised for producing blue light. The second active layers 42, 43 are each located in the second maximum M2. The second active layer 42 at position P42 is optimised for green light and the additional second active layer 43, which is located further away from the mirror 3, is optimised for red light.

FIGS. 3A to 3D illustrate emission spectra of the active layers 41, 42, 43. FIG. 3A illustrates the spectrum emitted by the first active layer 41 and is limited substantially to the blue spectral range.

FIG. 3B illustrates the emission of the second active layer 42 which is located closer to the mirror 3. Owing in particular to interference effects within the optical cavity 53, the emitted spectrum at about 570 nm has a minimum which is not particularly pronounced and at about 525 nm and 610 nm it has maxima.

The emission of the second active layer 43, which is located further away from the mirror 3, has a main emission range in the red spectral range at about 650 nm, see FIG. 3C. A pronounced minimum is present at about 560 nm.

The overall spectrum resulting from all three active layers 41, 42, 43 is illustrated in FIG. 3D. The overall spectrum only has comparatively weakly pronounced maxima and minima. A colour rendering index of the overall spectrum shown in FIG. 3D is about 95. The colour rendering index is abbreviated to CRI.

FIG. 4 illustrates, in curve c, an emission spectrum of the green-emitting organic material in the second active layers 42, 43 and, in curve d, an emission spectrum of the red-emitting radiation active material. The emission spectra are in each case comparatively wide spectra.

Curves a, b correspond to the wavelength ranges which are supported by the maxima in positions P42, P43 as per FIG. 2, in particular owing to interference effects. The supported spectral range in position P42 is illustrated in curve a and the supported spectral range for position P43 is illustrated in curve b. Owing to the combination of the second active layers 42, 43 and their location in positions P42, P43 in the second maxima M2, see FIG. 2, the spectral emission width of the radiation-emitting organic materials, see curves c, d, can be more efficiently utilised and a high colour rendering index can be achieved.

FIG. 5 schematically illustrates a conventional organic light-emitting diode. The light-emitting diode comprises the active layers 41, 46, 47. The active layers 41, 46, 47 in FIG. 5 are in the same positions as the active layers 41, 42, 43 in FIGS. 1 to 3. The active layer 41 has a blue-emitting organic material, the layer 46 has a green-emitting organic material and the active layer 47 has a red-emitting organic material. In each of the active layers 46, 47 there is only one of the radiation-emitting organic materials. In other words, the light-emitting diode of FIG. 5 has a so-called RGB structure.

The associated emission spectra are illustrated in FIGS. 6A to 6D, similarly to the illustration in FIG. 3. In contrast to FIGS. 3B and C, it can be seen that only green light or only red light is emitted by the active layers 46, 47 and not yellow mixed radiation in particular. A comparatively highly structured spectrum of the overall radiation is hereby produced, see FIG. 6D. The colour rendering index of the spectrum of FIG. 6D is only about 84.

In light-emitting diodes in which the different, colour-emitting layers each have only one organic, radiation-emitting material, although a colour rendering index can be increased by adding further layers having other organic materials, this significantly increases production costs. Likewise, the individual colour units age to varying extents and over the service life of the light-emitting diode the chromaticity co-ordinate of the radiation emitted by the light-emitting diode can shift considerably. In contrast, in the structure described in conjunction with FIG. 1, colour ageing and production costs are reduced. Also, comparatively thin organic layer sequences can be achieved.

The improved colour rendering index can thus be achieved in particular by virtue of the fact that in at least two of the three active layers, two radiation-emitting organic materials are present in each case, for two mutually different spectral ranges. These second active layers are positioned in intensity maxima for mutually different wavelengths. A spectral range of the radiation emitted in the respective second active layers can hereby be increased and strong structuring of the spectrum can hereby be reduced. A high colour rendering index can hereby be achieved.

FIG. 7 illustrates a further exemplified embodiment of the organic light-emitting diode 1. The individual layers in the main direction x are described hereinafter. The individual layers preferably directly follow each other in the stated sequence:

The mirror 3 is an aluminium mirror or a silver mirror having a thickness of, for example, about 200 nm. The electron injection layer 49 has a thickness of about 10 nm and is followed by an electron transport layer 34. Located on the electron transport layer 34 is the first active layer 41 which is arranged to emit blue light and has a thickness of about 20 nm. The first active layer 41 is followed by an electron barrier layer 44e which has a thickness of 10 nm and is, in turn, followed by the charge generation layer 45a having a thickness of about 100 nm, for example with a tolerance of at the most 15 nm.

This is followed by a hole barrier layer 43h having a thickness of 10 nm and the second active layer 42 having a green-emitting and a red-emitting material having a thickness of about 30 nm. This is followed by the next layer which is an electron barrier layer 44e, having a thickness of about 10 nm, and the charge generation layer 45b having a thickness of about 45 nm+/−15 nm. Disposed thereon is a hole barrier layer 44h having a thickness of 10 nm.

This is followed by the second one of the second active layers 43 having the same material composition as the second active layer 42 lying thereunder. Attached to the second active layer 43 is the electron barrier layer 44e having a thickness of 10 nm, followed by the hole injection layer 48 having a thickness of about 185 nm.

The organic layer sequence 4 is applied onto the radiation-permeable electrode 5 which is produced from indium-tin oxide and has a thickness of about 110 nm. A carrier 2 is, for example, a glass plate, a glass sheet or a synthetic material substrate.

The component of FIG. 7 has an operating voltage of 9 V and an operating current of 3.3 mA/cm². Efficiency is 21 lm/W. The chromaticity co-ordinate of the emitted radiation is 0.350; 0.386 in the CIE chromaticity diagram. A correlated colour temperature is 4900 K and a colour rendering index is 95. The associated overall spectrum can be seen in FIG. 8. The active layers 41, 42, 43 are positioned in a similar manner to FIG. 2.

In contrast to the arrangement described in conjunction with FIGS. 1 and 7, the first active layer 41 can be a layer having only a red-emitting organic material. In that case, the second active layers 42, 43 each have a green-emitting organic material and a blue-emitting organic material and are arranged to produce cyan mixed light. The first active layer 41 is preferably located in the first maximum M1 and the second active layers 42, 43 are preferably located in the second maximum M2, cf. FIG. 2.

The invention is not limited to the exemplified embodiments by the description thereof. Rather, the invention includes any new feature and any combination of features included in particular in any combination of features in the claims, even if this feature or this combination is not explicitly stated in the claims or exemplified embodiments.

The invention claimed is:

1. Organic light-emitting diode having a mirror and having an organic layer sequence comprising:
    a first active layer which is arranged to produce first radiation, and
    at least two second active layers which are arranged to produce second radiation, wherein
    the active layers are arranged one above the other in a main direction away from the mirror, and
    a charge generation layer is located in each case between two adjacent active layers, wherein
    the second active layers each have the same at least two radiation active organic materials and the first active layer has a radiation active organic material which is different therefrom,
    an optical cavity is formed by the mirror and by an optical boundary layer having a jump in the refractive index on a side of the organic layer sequence facing away from the mirror,
    the cavity has several intensity maxima in the main direction, wherein the active layers are each located in or on one of the intensity maxima in the main direction,
    a distance between the second active layers is smaller than a distance between the first active layer and the closest second active layer and
    the second active layers are optimised for mutually different wavelengths.

2. Organic light-emitting diode according to claim 1, wherein the active layers are each located at a position P, in the main direction, as per the following formula, with a tolerance of at the most $$\lambda/(10n):P=\lambda/(4n)+k\lambda/(2n),$$

wherein n is the average refractive index of the organic layer sequence for the wavelength λ and k is a natural number greater than or equal to zero.

3. Organic light-emitting diode according to claim 2, wherein for the first active layer, k=0, and for the second active layers, k>0.

4. Organic light-emitting diode according to claim 3, wherein for the second active layers, k=1.

5. Organic light-emitting diode according to claim 1, wherein the second active layers have either a green-emitting and additionally a red-emitting radiation active organic material or a blue-emitting and additionally a green-emitting radiation active organic material.

6. Organic light-emitting diode according to claim 1, wherein an average reflectivity of the optical boundary layer for the radiation produced during operation of the light-emitting diode is between 25% and 60% inclusive.

7. Organic light-emitting diode according to claim 1, wherein the second active layers have the same material composition but different thicknesses.

8. Organic light-emitting diode according to claim 1, wherein a distance between adjacent active layers is adjusted by a thickness of the respective charge generation layers, wherein in each case at least one barrier layer is allocated to the active layers and the charge generation layers adjoin the barrier layers, and at least two of the charge generation layers have mutually different thicknesses.

9. Organic light-emitting diode according to claim 1,
wherein the thicknesses of the active layers, together with the respectively associated barrier layers, are between 25 nm and 50 nm inclusive, wherein the thicknesses of the charge generation layers are between 20 nm and 150 nm inclusive and the thickness of the organic layer sequence is between 150 nm and 600 nm inclusive.

10. Organic light-emitting diode according to claim 1,
wherein the first active layer is arranged to produce blue light,
wherein the second active layers each have a green-emitting and additionally a red-emitting radiation active organic material, and
wherein the second active layer located closer to the mirror is arranged to produce green light and the second active layer located further away from the mirror is arranged to produce red light.

11. Organic light-emitting diode having a mirror and having an organic layer sequence comprising:
a first active layer which is arranged to produce first radiation, and
at least two second active layers which are arranged to produce second radiation, wherein
the active layers are arranged one above the other in a main direction away from the mirror, and
a charge generation layer is located in each case between two adjacent active layers, wherein
the second active layers each have the same at least two radiation active organic materials and the first active layer has a radiation active organic material which is different therefrom,
an optical cavity is formed by the mirror and by an optical boundary layer having a jump in the refractive index on a side of the organic layer sequence facing away from the mirror,
the cavity has several intensity maxima in the main direction, wherein the active layers are each located in or on one of the intensity maxima in the main direction,
a distance between the second active layers is smaller than a distance between the first active layer and the closest second active layer and
the second active layers are optimised for mutually different wavelengths,
the active layers are each located at a position P, in the main direction, as per the following formula, with a tolerance of at the most $\lambda/(10\,n)$:

$$P=\lambda/(4n)+k\lambda/(2n),$$

wherein n is the average refractive index of the organic layer sequence for the wavelength $\lambda$ and k is a natural number greater than or equal to zero, and $\lambda$ relates to the vacuum wavelength of the radiation, the relevant active layer being arranged for the production thereof.

* * * * *